(12) United States Patent
Huang

(10) Patent No.: US 11,227,134 B2
(45) Date of Patent: Jan. 18, 2022

(54) METHOD AND DEVICE FOR SYNCHRONOUSLY COLLECTING FINGERPRINT INFORMATION

(71) Applicant: SHANGHAI HARVEST INTELLIGENCE TECHNOLOGY CO., LTD., Shanghai (CN)

(72) Inventor: Jiandong Huang, Shanghai (CN)

(*) Notice: Subject to any disclaimer, the term of this patent is extended or adjusted under 35 U.S.C. 154(b) by 0 days.

(21) Appl. No.: 16/630,853

(22) PCT Filed: Mar. 20, 2018

(86) PCT No.: PCT/CN2018/079612
§ 371 (c)(1),
(2) Date: Jan. 13, 2020

(87) PCT Pub. No.: WO2019/010998
PCT Pub. Date: Jan. 17, 2019

(65) Prior Publication Data
US 2020/0143136 A1      May 7, 2020

(30) Foreign Application Priority Data

Jul. 12, 2017  (CN) .......................... 20171056875.X

(51) Int. Cl.
| G06K 9/00 | (2006.01) |
| G02F 1/1333 | (2006.01) |
| G06F 3/0488 | (2013.01) |
| H01L 27/32 | (2006.01) |

(52) U.S. Cl.
CPC ..... *G06K 9/00013* (2013.01); *G02F 1/13338* (2013.01); *G06F 3/0488* (2013.01); *G06K 9/00087* (2013.01); *H01L 27/323* (2013.01); *H01L 2227/323* (2013.01)

(58) Field of Classification Search
None
See application file for complete search history.

(56) References Cited

U.S. PATENT DOCUMENTS

| 2015/0213321 | A1* | 7/2015 | Okazaki | G06K 9/3216 |
| | | | | 382/116 |
| 2016/0132177 | A1* | 5/2016 | Bae | G06F 3/04166 |
| | | | | 345/174 |
| 2017/0053149 | A1* | 2/2017 | Jiang | G06K 9/0008 |
| 2017/0344783 | A1* | 11/2017 | Zhang | G06F 3/03547 |
| 2018/0224999 | A1* | 8/2018 | Lee | G06F 3/0488 |
| 2018/0365477 | A1* | 12/2018 | Seol | G06F 3/0486 |

* cited by examiner

*Primary Examiner* — Joseph R Haley

(57) ABSTRACT

The present invention provides a method and a device for synchronously collecting fingerprint information. By setting a fingerprint recognition area on a display unit of a terminal, and placing a sensing unit below the fingerprint recognition area to receive a sliding track of the user's finger on the display unit and, when the user's finger slides to the fingerprint recognition area, to synchronously collect fingerprint information corresponding to the user's finger, thereby synchronously collecting the user's sliding track information (such as an electronic signature) and the user's fingerprint information, and effectively reducing the user's operation steps and improving user's experience.

24 Claims, 3 Drawing Sheets

METHOD AND DEVICE FOR SYNCHRONOUSLY COLLECTING FINGERPRINT INFORMATION

TECHNICAL FIELD

The present invention relates to the field of electronic device control, and particularly to a method and a device for synchronously collecting fingerprint information.

BACKGROUND

With the development of science and advances in technology, touch display panels have been widely used in devices that require human-computer interaction interfaces, such as operating screens of industrial computers, touch screens of tablet computers and smart phones, etc. As these devices are usually accompanied by a large amount of user information during use, the protection of user information security is particularly important. Among many methods of information security protection, fingerprint recognition encryption is an important one.

At the same time, electronic signatures have been widely used. For example, when a consumer uses a credit card for consumption, the merchant usually requires the consumer to sign the name for archival purposes, and the electronic signature has the characteristics of being easy to store and highly recognizable compared to the paper signature. However, in the prior art, the electronic signature and the fingerprint recognition are often independent, that is, when the user leaves his or her own electronic signature on the mobile terminal, the terminal cannot collect the user's fingerprint synchronously, and is not able to perform the fingerprint recognition operation. When the fingerprint is needed, the user's fingerprint needs to be collected again, which is cumbersome and brings a bad experience to the user.

In summary, it is particularly necessary to provide a solution for synchronously collecting user's fingerprint when the user performs electronic signature, so as to reduce the user's operation steps and improve user's experience.

SUMMARY

The technical problem to be solved by the present invention is to provide a technical solution for synchronously collecting fingerprint information, which is used to solve the problem that the terminal cannot collect the user's fingerprint synchronously when receiving the user's electronic signature, resulting in an increase in user's operation steps and a poor user experience.

In order to solve the above technical problem, the present invention adopts the following technical solution: a method for synchronously collecting fingerprint information; the method is applied to a device for synchronously collecting fingerprint information; the device includes a display unit and a sensing unit; the display unit is provided with a fingerprint recognition area, and the sensing unit is located below the fingerprint recognition area for acquiring fingerprint information on the fingerprint recognition area. The method includes the following steps:

receiving a sliding track of a user's finger on the display unit; and synchronously collecting fingerprint information corresponding to the user's finger when the user's finger slides to the fingerprint recognition area.

Further, the display unit includes a touch unit; the step of "receiving the sliding track of the user's finger on the display unit" includes:

the sensing unit or the touch unit receives the sliding track of the user's finger on the display unit, generates sliding track information, and stores the sliding track information.

Further, the method includes:

presetting operation configuration information; and the operation configuration information includes a corresponding relationship between operation instruction and preset fingerprint information;

determining whether the fingerprint information corresponding to the user's finger collected synchronously matches the preset fingerprint information in the operation configuration information; if yes, executing the operation instruction corresponding to the preset fingerprint information in the operation configuration information; and if not, the operation instruction corresponding to the preset fingerprint information in the operation configuration information is not executed.

Further, the step of "presetting the operation configuration information" includes:

receiving the user's setting instruction and displaying the fingerprint recognition area;

acquiring and saving the user's fingerprint information on the fingerprint recognition area;

displaying an operation instruction identifier list; and the operation instruction identifier list includes one or more identifiers corresponding to operation instructions, and each operation instruction identifier corresponds to one operation instruction;

receiving the user's selecting instruction for the operation instruction identifier; and establishing and saving a corresponding relationship between the operation instruction corresponding to a selected operation instruction identifier and the acquired fingerprint information.

Further, the device includes a storage unit, and the step of "acquiring and saving the user's fingerprint information on the fingerprint recognition area" includes:

determining whether the fingerprint information in the user setting process has been stored in the storage unit; when the determination is yes, prompting the user that the fingerprint information has been recorded; and when the determination is no, saving the fingerprint information to the storage unit.

Further, the method further includes the step of:

issuing a prompt information when the preset fingerprint information matching the acquired fingerprint information is not recognized.

Further, the prompt information includes one or more of voice prompt information, image prompt information, light prompt information, and video prompt information.

Further, the step of "determining whether the fingerprint information corresponding to the user's finger collected synchronously matches the preset fingerprint information in the operation configuration information" includes: calculating a feature value according to the fingerprint information corresponding to the user's finger synchronously collected by the sensing unit, and comparing the feature value with that of the preset fingerprint information; when the error is smaller than the preset error, it is determined as a match; otherwise, it is determined as a mismatch.

Further, the operation instruction includes one or more of a system initiation instruction, a text operation instruction, an image operation instruction, a video operation instruction, and an application operation instruction.

Further, the device includes a storage unit; and the method further includes: storing the fingerprint information corresponding to the user's finger collected synchronously in the storage unit.

Further, the sensing unit includes a TFT image sensor array thin-film.

Further, the display unit is a display screen with an active array thin film transistor for scanning drive and data transmission, including an AMOLED display, a liquid crystal display (LCD), a micro light-emitting diode display, a quantum dot display, or an electronic ink display.

Further, when the display unit is the LCD display or the electronic ink display, a backlight unit is further disposed below the sensing unit, and the sensing unit is disposed between the backlight unit and the LCD display, or between the backlight unit and the electronic ink display.

Further, the sensing unit includes a TFT image sensor array thin-film; when the display unit is the LCD display or the electronic ink display, the TFT image sensor array thin-film includes an infrared sensing layer; and the infrared sensing layer is an array formed by an infrared photodiode or an infrared phototransistor.

Further, the fingerprint recognition area includes a plurality of fingerprint recognition sub-areas, and a lower portion of each of the fingerprint recognition sub-areas is correspondingly provided with a sensing unit.

Further, the method includes:
receiving the user's turning-on instruction for the fingerprint recognition sub-area, and turning on a sensing unit disposed on the lower portion of the fingerprint recognition sub-area; or
receiving the user's turning-off instruction for the fingerprint recognition sub-area, and turning off the sensing unit disposed on the lower portion of the fingerprint recognition sub-area.

The inventor further provides a device for synchronously collecting fingerprint information. The device includes a display unit and a sensing unit. The display unit is provided with a fingerprint recognition area; and the sensing unit is located below the fingerprint recognition area for acquiring fingerprint information on the fingerprint recognition area. The device includes a sliding track receiving unit.

The sliding track receiving unit is configured to receive a sliding track of the user's finger on the display unit. Moreover, when the user's finger slides to the fingerprint recognition area, the sensing unit is configured to synchronously collect fingerprint information corresponding to the user's finger.

Further, the display unit includes a touch unit, a processing unit, and a storage unit. The sliding track receiving unit is a sensing unit or a touch unit. The "sliding track receiving unit is configured to receive the sliding track of the user's finger on the display unit" includes:
the sensing unit or the touch unit is configured to receive the sliding track of the user's finger on the display unit to generate sliding track information, and the processing unit is configured to store the sliding track information in the storage unit.

Further, the device includes an operation information setting unit, a determining unit, and a processing unit.

The operation information setting unit is configured to preset operation configuration information. The operation configuration information includes a corresponding relationship between the operation instruction and the preset fingerprint information.

The determining unit is configured to determine whether the fingerprint information corresponding to the user' finger collected synchronously matches the preset fingerprint information in the operation configuration information; if yes, the processing unit is configured to execute an operation instruction corresponding to the preset fingerprint information in the operation configuration information; and if not, the processing unit does not execute the operation instruction corresponding to the preset fingerprint information in the operation configuration information.

Further, the device further includes an operation instruction receiving unit. The "operation information setting unit is configured to preset the operation configuration information" includes:
the operation instruction receiving unit is configured to receive the user's setting instruction and display the fingerprint recognition area;
the sensing unit is configured to acquire and save the user's fingerprint information on the fingerprint recognition area;
the display unit is configured to display an operation instruction identifier list; and the operation instruction identifier list includes one or more identifiers corresponding to operation instructions. In some embodiment, each operation instruction identifier corresponds to one operation instruction;
the operation instruction receiving unit is further configured to receive the user's selecting instruction for the operation instruction identifier; and the processing unit is configured to establish and save a corresponding relationship between the operation instruction corresponding to a selected operation instruction identifier and the acquired fingerprint information.

Further, the device includes a storage unit, and the "sensing unit is configured to acquire and save the user's fingerprint information on the fingerprint recognition area" includes:
the determining unit is configured to determine whether the fingerprint information in the user setting process has been stored in the storage unit; when the determination is yes, the processing unit is configured to prompt the user that the fingerprint information has been recorded; and when the determination is negative, the processing unit is configured to save the fingerprint information to the storage unit.

Further, the processing unit is further configured to issue a prompt information when the preset fingerprint information matching the acquired fingerprint information is not recognized.

Further, the prompt information includes one or more of voice prompt information, image prompt information, light prompt information, and video prompt information.

Further, the "determining unit is configured to determine whether the fingerprint information corresponding to the user' finger collected synchronously matches the preset fingerprint information in the operation configuration information" includes: the processing unit is configured to calculate a feature value according to the fingerprint information corresponding to the user's finger synchronously collected by the sensing unit, and the determining unit is configured to compare the calculated feature value with that of the preset fingerprint information; when the error is smaller than the preset error, it is determined as a match; otherwise, it is determined as a mismatch.

Further, the operation instruction includes one or more of a system initiation instruction, a text operation instruction, an image operation instruction, a video operation instruction, and an application operation instruction.

Further, the device includes a storage unit; and the processing unit is further configured to store the fingerprint information corresponding to the user's finger collected synchronously in the storage unit.

Further, the sensing unit includes a TFT image sensor array thin-film.

Further, the display unit is a display screen with an active array thin film transistor for scanning drive and data transmission, including an AMOLED display, a liquid crystal display (LCD display), a micro light-emitting diode display, a quantum dot display, or an electronic ink display.

Further, when the display unit is the LCD display or the electronic ink display, a backlight unit is further disposed below the sensing unit, and the sensing unit is disposed between the backlight unit and the LCD display, or between the backlight unit and the electronic ink display.

Further, the sensing unit includes a TFT image sensor array thin-film; when the display unit is the LCD display or the electronic ink display, the TFT image sensor array thin-film includes an infrared sensing layer; and the infrared sensing layer is an array formed by an infrared photodiode or an infrared phototransistor.

Further, the fingerprint recognition area includes a plurality of fingerprint recognition sub-areas, and a lower portion of each of the fingerprint recognition sub-areas is correspondingly provided with a sensing unit.

Further, the device includes an operation instruction receiving unit and a sensing unit control circuit. The operation instruction receiving unit is configured to receive the user's turning-on instruction for the fingerprint recognition sub-areas, and the sensing unit control circuit is configured to turn on the sensing unit disposed on the lower portion of each of the fingerprint recognition sub-areas; or, the operation instruction receiving unit is configured to receive the user's turning-off instruction for the fingerprint recognition sub-areas, and the sensing unit control circuit is configured to turn off the sensing unit disposed on the lower portion of each of the fingerprint recognition sub-areas.

The beneficial effects of the present invention after adopting the above technical solutions are as follows. By setting a fingerprint recognition area on the display unit of a terminal and placing a sensing unit below the fingerprint recognition area, the sliding track of the user's finger on the display unit is received, and when the user's finger slides to the fingerprint recognition area, the fingerprint information corresponding to the user's finger is synchronously collected. Therefore, the synchronous collection of the user's sliding information and the fingerprint information is realized, which effectively reducing the user's operation steps and improving the user's experience.

DETAILED DESCRIPTION OF THE EMBODIMENTS

Figure 1:
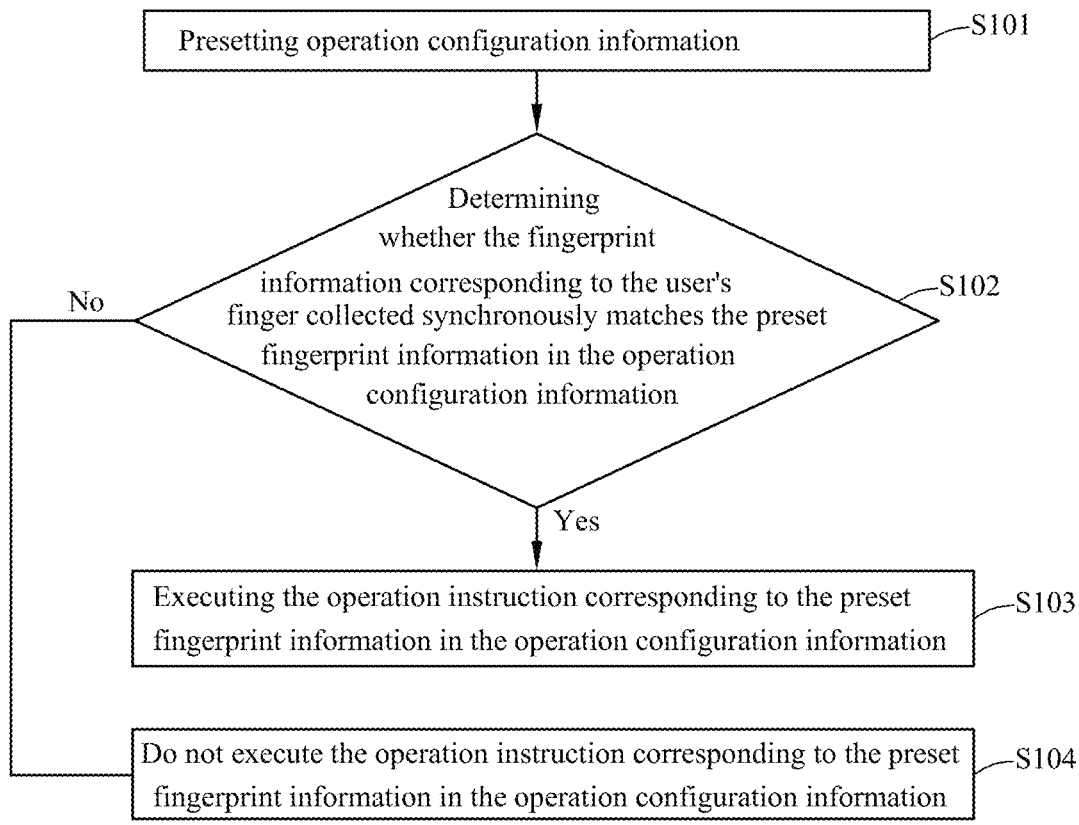
FIG. 1 is a process flow diagram of a method for synchronously collecting fingerprint information according to an embodiment of the present invention.

In order to illustrate the technical content, structural features, and the objects and effects of the present invention in detail, the present invention will be described in detail below with reference to the embodiments and the drawings.

The inventor provides a method for synchronously collecting fingerprint information. The method is applied to a device for synchronously collecting fingerprint information. The device includes a display unit and a sensing unit. The display unit is provided with a fingerprint recognition area, and the sensing unit is located below the fingerprint recognition area for acquiring fingerprint information on the fingerprint recognition area. The device is an electronic device with a touch screen display, such as a smart mobile device, including a mobile phone, a tablet computer, a personal digital assistant, etc., or an electronic device, including a personal computer, a computer for industrial equipment, etc. The method includes the following steps:

receiving a sliding track of the user's finger on the display unit; and synchronously collecting fingerprint information corresponding to the user's finger when the user's finger slides to the fingerprint recognition area. The display unit is a display screen with an active array thin film transistor for scanning drive and data transmission, including an AMOLED display, a liquid crystal display (LCD display), a micro light-emitting diode display, a quantum dot display, or an electronic ink display.

In this embodiment, the coverage of the sensing unit is adapted to the size of the touch screen display, which allows the sensing unit to capture the user's fingerprint information no matter how the user's finger slides on the display screen. The sliding track is a motion track of the user's finger on the display unit, which may be a single-finger operation or a multi-finger operation. The motion track of the user's finger includes, but is not limited to, lines, graphics, Chinese characters, etc. When the sliding track is operated by the user through multiple fingers, if multiple fingers are in the fingerprint recognition area during the sliding process, the sensing unit collects the fingerprint information corresponding to the fingers.

In other embodiments, the sensing unit may also be multiple, as long as the multiple sensing units are spliced to fit the size of the display unit and placed below the display unit. Compared with sensing units occupying a large area, the sensing units with a small area are easier to produce and process, thus saving production costs.

In other embodiments, preferably, the fingerprint recognition area may also be an area smaller than the size of the display screen, for example, ½ or ¼ of the overall size of the display screen. Preferably, the shape of the fingerprint recognition area is rectangular, the size of the rectangle is adapted to be located at the center of the display unit, and the size of the sensing unit is adapted to the size of the fingerprint recognition area. In this embodiment, when the user's finger slides on the display screen, if the finger is located in the fingerprint recognition area, the fingerprint information will not be recognized because the sensing unit is not provided in the area outside the fingerprint recognition area. When the user's finger slides to the fingerprint recognition area, the sensing unit will capture the user's fingerprint information. Since the sensing unit only occupies part of the area of the display unit, the production cost can be effectively saved compared to the full-screen coverage mode.

In some embodiments, the display unit includes a touch unit. The step of "receiving the sliding track of the user's finger on the display unit" includes: the sensing unit or the touch unit receives the sliding track of the user's finger on the display unit, generates sliding track information, and stores the sliding track information. The touch unit may be a touch screen, and the touch screen may be used to sense a user's touch operation thereon, including a sliding track operation. The sliding track information and the fingerprint information may both be acquired by the sensing unit, or the sliding track information may be acquired by the touch unit, and the fingerprint information is captured by the sensing unit. In brief, for a terminal with a touch screen, the sliding track information is captured by the sensing unit or the touch unit, which effectively improves the application scope of the device.

FIG. 1 shows a process flow diagram of a method for synchronously collecting fingerprint information according to an embodiment of the present invention. The method further includes the below steps.

First, proceed to step S101 to preset operation configuration information; and the operation configuration information includes a corresponding relationship between operation instruction and preset fingerprint information. The preset fingerprint information is the fingerprint information entered and stored in advance. Each fingerprint information may correspond to an operation instruction, and each operation instruction may be triggered by one or more fingerprint information. The corresponding relationship between the operation instruction and the preset fingerprint information may be stored in a storage unit of the device, such as a memory of a mobile phone or a hard disk of a computer, or may be stored in a storage unit of a server. When the preset operation configuration information needs to be acquired, it is only necessary to establish a communication connection between the device and the server, and then acquire the corresponding relationship between the operation instruction and the preset fingerprint information from the server. The communication connection includes a wired communication connection or a wireless communication connection.

Then, the process proceeds to step S102 to determine whether the fingerprint information corresponding to the user's finger that is synchronously collected matches the preset fingerprint information in the operation configuration information; if yes, the process proceeds to step S103 to execute the operation instruction corresponding to the preset fingerprint information in the operation configuration information; and if not, the process proceeds to step S104, i.e., the operation instruction corresponding to the preset fingerprint information in the operation configuration information is not executed. The comparison of fingerprint information can be implemented by a fingerprint recognition algorithm, and the fingerprint recognition algorithm can be stored in the storage unit of the device. After the sensing unit acquires the fingerprint information in the fingerprint recognition area, the processor of the device will call the fingerprint recognition algorithm in the storage unit to compare the acquired fingerprint information with the preset fingerprint information and determine whether they are matched or not. Fingerprint recognition algorithms include the steps of preprocessing of fingerprint images, data feature extraction, feature matching, fingerprint recognition, etc., which can be implemented by a variety of algorithms. These algorithms are mature existing technologies and have been applied in various fields of encryption and decryption, which are not exhaustively described and repeated in the embodiments again.

Figure 2:
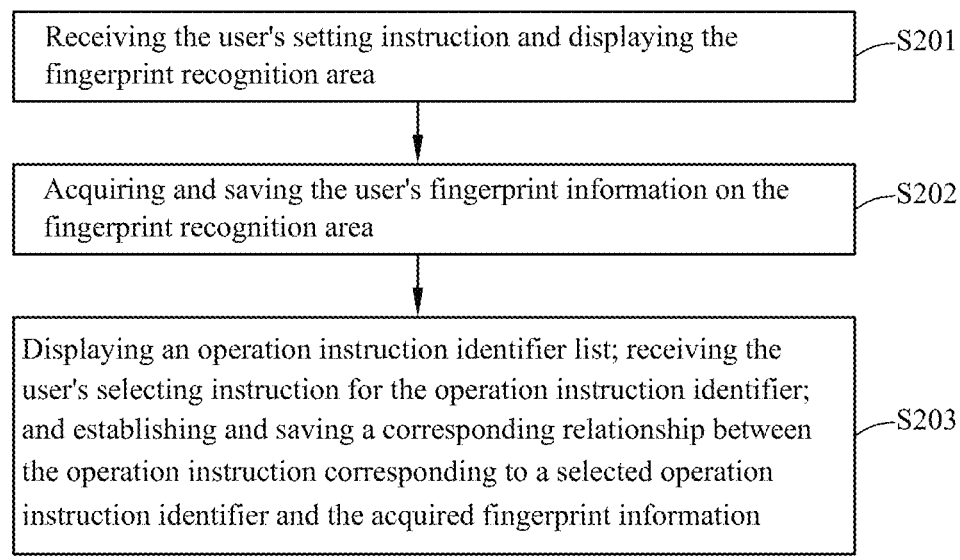
FIG. 2 is a process flow diagram of a method for synchronously collecting fingerprint information according to another embodiment of the present invention.
Figure 3:
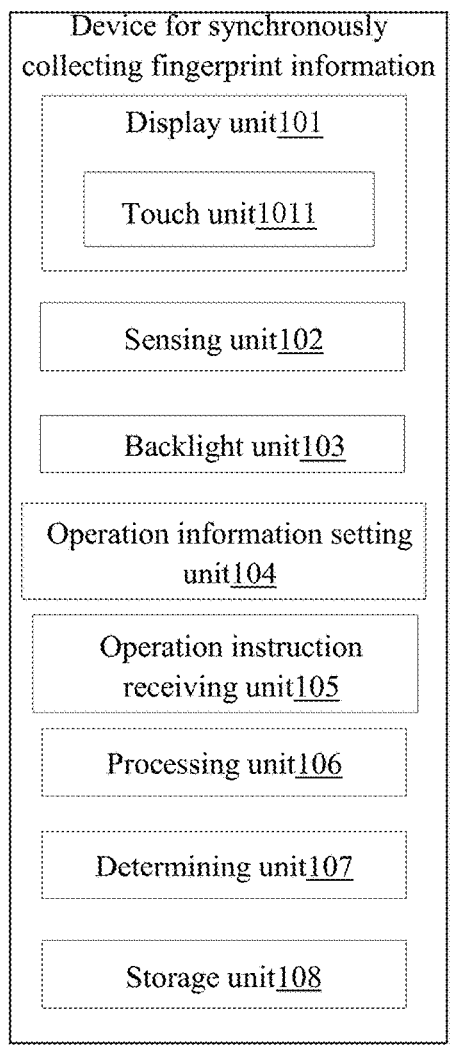
FIG. 3 is a schematic diagram of a device for synchronously collecting fingerprint information according to an embodiment of the present invention.
Figure 4:
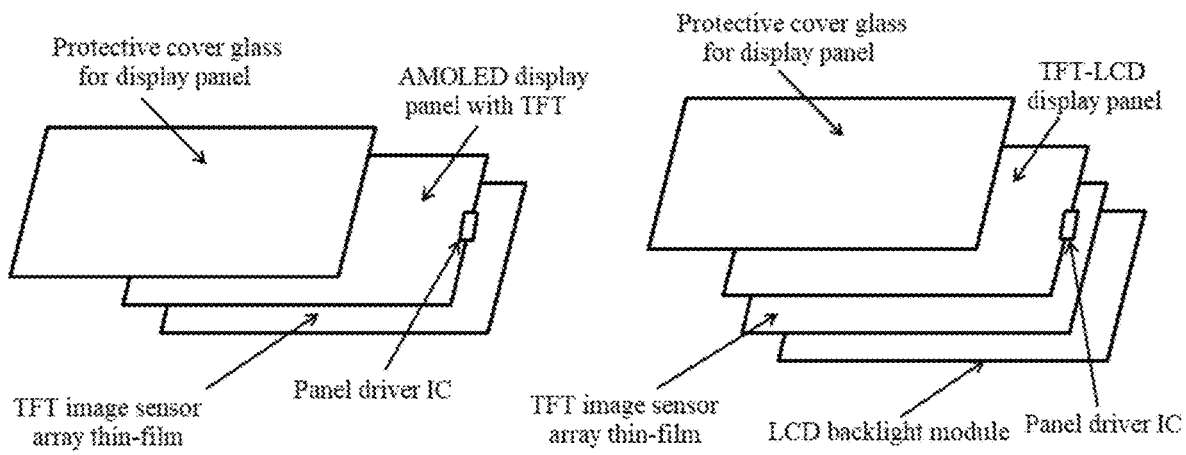
FIG. 4 is a schematic diagram of a device for synchronously collecting fingerprint information according to another embodiment of the present invention.

Referring to FIG. 2, which shows a process flow diagram of a method for synchronously collecting fingerprint information according to another embodiment of the present invention. The step of "preset the operation configuration information" includes the below steps.

First, proceed to step S201 to receive the user's setting instruction and display the fingerprint recognition area. The setting instruction can be triggered by the user clicking a button in a setting bar on the screen of a terminal. After receiving the setting instruction, the device will display the fingerprint recognition area to facilitate the user to input the fingerprint information. In this embodiment, displaying the fingerprint recognition area may include: enhancing the brightness of the fingerprint recognition area or displaying an input prompt box on the fingerprint recognition area. In some embodiments, before receiving the user's setting instruction, the method further includes the step of receiving user's account information, where the account information includes a user ID and a password. The user needs to input the correct user ID and password to log in the user account before triggering the setting instruction, which on the one hand can improve the security of fingerprint information setting, and on the other hand can achieve the effect of distinguishing different users and saving different fingerprint information on one device.

Then, the process proceeds to step S202 to acquire and save the user's fingerprint information on the fingerprint recognition area. When the front-end of the user's finger contacts the fingerprint recognition area, the collected fingerprint information is preset fingerprint information, and the collected fingerprint information is stored in the storage unit. In this embodiment, the device includes a storage unit, and the step of "acquire and save the user's fingerprint information on the fingerprint recognition area" includes: determining whether the fingerprint information in the user setting process has been stored in the storage unit; when the determination is yes, prompting the user that the fingerprint information has been recorded; and when the determination is negative, saving the fingerprint information to the storage unit, which can effectively avoid repeated input of fingerprint information.

Then, the process proceeds to step S203 to display an operation instruction identifier list, receive the user's selecting instruction for the operation instruction identifier, and establish and save a corresponding relationship between the operation instruction corresponding to a selected operation instruction identifier and the acquired fingerprint information. The operation instruction identifier list includes one or more identifiers corresponding to operation instructions, each operation instruction identifier corresponds to one operation instruction. The selection instruction can be triggered by the user clicking the check box, double clicking, etc. In this way, according to their own needs, the user can set the more important operations (such as payment operations, startup of certain applications, etc.) to require fingerprint information to be executable; and for less important operations, no selection settings are made.

In some embodiments, the method further includes the step of: issuing a prompt information when the preset fingerprint information matching the acquired fingerprint information is not recognized. The prompt information includes one or more of voice prompt information, image prompt information, light prompt information, and video prompt information. The "preset fingerprint information matching the acquired fingerprint information is not recognized" usually includes two situations. The first situation is the failure of fingerprint recognition, that is, the fingerprint information is pre-stored in the storage unit, but in the process of acquiring the user's fingerprint information, due to the front-end of user's finger is not fully contacted with the screen, the collected fingerprint information is not complete, leading to the failure of fingerprint recognition. The second situation is that the fingerprint information is not stored in the storage unit.

For the first situation, when the device fails to recognize the preset fingerprint information matching the acquired fingerprint information, the device may issue audible prompt information or image prompt information. The voice prompt information includes voice prompt information that prompt the user to input the fingerprint again, and the image prompt information includes pop-up prompt information that prompt the user to input the fingerprint again. When the number of times of acquiring the fingerprint information input by the user exceeds the preset number of times, and the preset fingerprint information matching the acquired fingerprint information is not recognized, it is determined that the fingerprint information is not stored in the storage unit, i.e., the foregoing mentioned second situation.

For the second situation, the device can also issue image prompt information, such as pop-ups that prompt the user that the current fingerprint information is not recorded; or a video prompt information can also be issued. The video prompt information contains a tutorial on how to input new fingerprint information, and the user can complete the input of new fingerprint information according to the video prompt information. Of course, the prompt information can also be realized by vibration, light sense prompt, and other means. In brief, the prompt information is only for the user to know that "there is no fingerprint information matching the fingerprint information acquired this time" as soon as possible, and the selection of the prompt information form can be adjusted according to the settings of different manufacturers.

In some embodiments, the step of "determining whether the fingerprint information corresponding to the user's finger collected synchronously matches the preset fingerprint information in the operation configuration information" includes: calculating a feature value according to the fingerprint information corresponding to the user's finger synchronously collected by the sensing unit, and comparing the feature value with that of the preset fingerprint information; when the error is smaller than the preset error, it is determined as a match; otherwise, it is determined as a mismatch.

In some embodiments, the operation instruction includes one or more of a system initiation instruction, a text operation instruction, an image operation instruction, a video operation instruction, and an application operation instruction. The system initiation instruction is a startup instruction of a terminal or a startup instruction of an operating system. The image operation instruction is one or more of an image opening, deleting, editing, transforming, and moving instructions. The video operation instruction is one or more of a video opening, deleting, editing, transforming, and moving instructions. The application operation instruction includes one or more of opening, deleting and moving instructions of an application (such as a terminal APP), and may also be an operation instruction such as browsing and payment during the running of the application.

In some embodiments, the device includes a storage unit; and the method further includes: storing the fingerprint information corresponding to the user's finger collected synchronously in the storage unit. After the sensing unit collects the fingerprint information of the use's finger, the comparison of the fingerprint information may not be performed immediately, or the fingerprint information may be extracted and called after a period of time. Preferably, the storage unit is a non-volatile memory, such as a mobile phone memory, a hard disk, a USB flash drive, etc.

Figure 5:
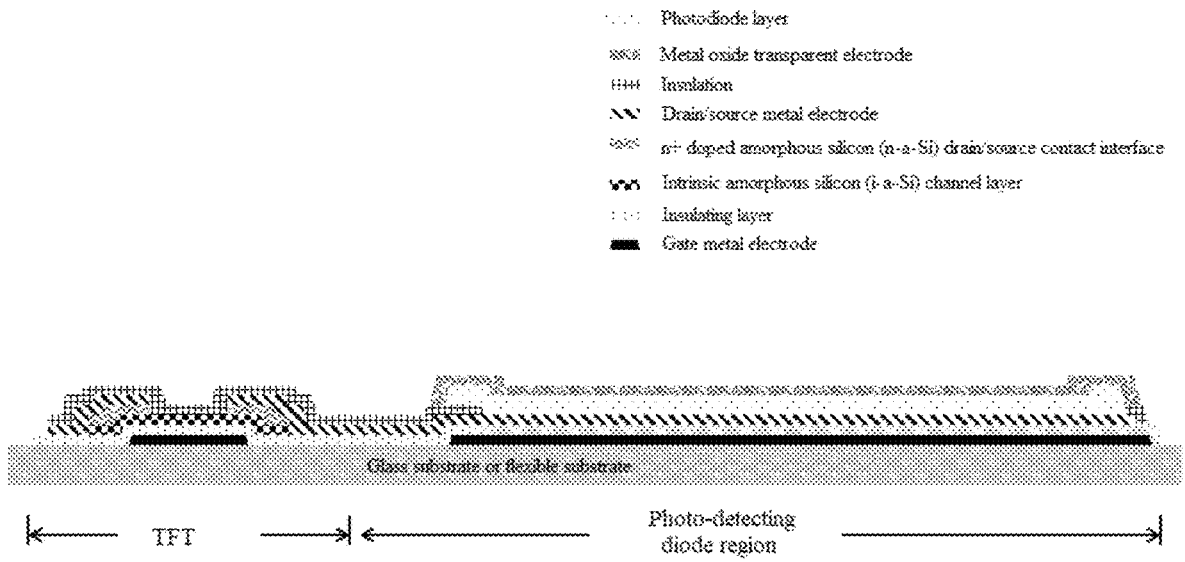
FIG. 5 is a schematic diagram of a sensing unit according to an embodiment of the present invention.

As shown in FIG. 5, in some embodiments, the sensing unit includes a TFT image sensor array thin-film, and the photo detection sensing layer is an array formed by photodiodes. An LCD display panel or an organic light-emitting diode (OLED) display panel is driven by a TFT structure to scan a single pixel to realize a display function of a pixel array on the panel. The main structure for implementing the TFT switching function is a semiconductor field effect transistor (FET), and the well-known semiconductor layer materials mainly include amorphous silicon, polycrystalline silicon, indium gallium zinc oxide (IGZO), organic compounds mixed with nanocarbon materials, etc. Since the structure of the photo-detecting diode can also be prepared by using such semiconductor materials, and the production equipment is also compatible with the production equipment of TFT array, in recent years, the TFT photo-detecting diodes have been produced in the form of TFT arrays. The TFT image sensor array thin-film described in this embodiment is the above-mentioned TFT photo-detecting diode (see the photo-detecting diode region part in FIG. 5). The specific structure of the TFT photo-detecting diode can refer to the description of the structures of the sensing units in the U.S. Pat. No. 6,943,070B2, Chinese Patent No. CN204808361U. The difference between the production process of the TFT image sensor array thin-film and the production process of the TFT structure of the display panel is that the pixel opening area on the display panel was changed to the photo-detecting area during the production process. The TFT can be prepared by using a thin glass as a substrate or a high-temperature resistant plastic material as a substrate, as described in U.S. Pat. No. 6,943,070B2.

In order to make the sensing unit can still collect the user's fingerprint information when the display unit is a non-self-illuminating display screen, in some embodiments, the photodiode is an infrared photodiode, and the infrared photodiode includes an infrared sensing layer. The infrared sensing layer can be used to sense an infrared signal, so that the sensing unit can synchronously capture the fingerprint information of the user's finger. The sensing unit shown in FIG. 5 is susceptible to the reflection and refraction of surrounding ambient light or visible light emitted by the pixels of the display screen and other factors, causing optical interference and seriously affecting the signal-to-noise ratio (SNR) of the TFT image sensor array thin-film embedded under the display panel. In order to improve the SNR, a further improvement can be made on the sensing unit shown in FIG. 5, so that the TFT image sensor array thin-film can detect the infrared signal identifying the user characteristic information.

Figure 6:
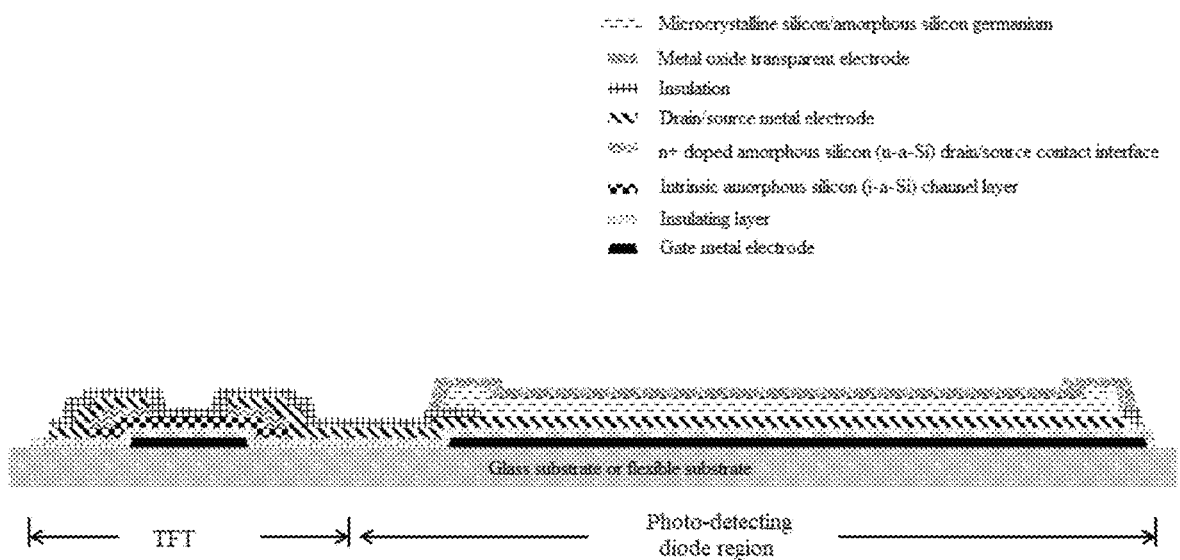
FIG. 6 is a schematic diagram of a sensing unit according to another embodiment of the present invention.

In some embodiments, the sensing unit includes a TFT image sensor array thin-film; when the display unit is the LCD display or the electronic ink display, the TFT image sensor array thin-film includes an infrared sensing layer; and the infrared sensing layer is an array formed by an infrared photodiode or an infrared phototransistor. As shown in FIG. 6, in order to expand the wavelength of the optical signal that can be recognizable by the TFT image sensor array thin-film from the visible light range to the infrared light range and make the sensing unit can still capture the user's fingerprint information when the display unit is a non-self-illuminating display screen (such as LCD display or electronic ink display), it is necessary to improve the TFT image sensor array thin-film shown in FIG. 5. The improvement is specifically to replace the photodiode layer of the TFT image sensor array thin-film shown in FIG. 5 by using an infrared photodiode, and the infrared photodiode includes a microcrystalline silicon photodiode or an amorphous silicon compound photodiode.

Embodiment 1: the amorphous silicon p-type/i-type/n-type (PIN type) photo diode structure (i.e., photodiode layer shown in FIG. 5) was changed to a microcrystalline silicon p-type/i-type/n-type photodiode structure. In this embodiment, the degree of micro-crystallization of the photodiode is mainly determined by mixing gaseous hydrogen silane ($SiH_4$) with appropriate concentration of hydrogen to control the hydrogen bond to bind with the dangling bond of the amorphous silicon during the chemical vapor deposition process, so as to achieve the coating of microcrystalline silicon p-type/i-type/n-type photodiode structure. By adjusting the hydrogen concentration of chemical vapor deposition process, the operating wavelength range of the microcrystalline photodiode can be expanded to the light wavelength range of 600 nm to 1000 nm.

In the embodiment using the microcrystalline photodiode, in order to further improve the quantum efficiency of the photoelectric conversion, the microcrystalline silicon photodiode can also be formed by serially connecting double-junction or multi junction p-type/i-type/n-type structures. The p-type/i-type/n-type material of the first junction layer of the photodiode is still an amorphous structure, and the p-type/i-type/n-type material of the second junction layer or the other junction layers may be a microcrystalline structure or a polycrystalline structure.

Embodiment 2: amorphous silicon p-type/i-type/n-type photodiode structure (photodiode layer in FIG. 5) is changed to a p-type/i-type/n-type photodiode structure doped with an amorphous silicon compound having an expandable photosensitive wavelength range. The amorphous silicon compound of a preferred embodiment is amorphous silicon germanium. In this embodiment, during the coating process of intrinsic layer (i type) of the photodiode by using chemical vapor deposition method, gas germane ($GeH_4$) mixed with silane ($SiH_4$) was introduced, so that the photosensitive range of the amorphous silicon germanium p-type/i type/n-type photodiode can reach a wavelength range of 600 nm to 1000 nm.

In the embodiment using the amorphous silicon compound photodiode, in order to improve the quantum efficiency of the photoelectric conversion, the amorphous silicon photodiode can also be formed by serially connecting double-junction or multi junction p-type/i-type/n-type structures. The p-type/i-type/n-type material of the first junction layer of the photodiode is still an amorphous silicon structure, and the p-type/i-type/n-type material of the second junction layer or the other layers may be a microcrystalline structure, a polycrystalline structure, or a material doped with a compound having an expandable photosensitive wavelength range.

When the infrared sensing layer is an array formed by an infrared photodiode, in practical application process, a TFT was used for scanning drive and a bias voltage (including positive bias, zero bias or negative bias) was applied between the p-type/i-type/n-type photodiode, thus the infrared light emitting function of TFT image sensor array thin-film can be realized.

In some embodiments, the first trigger signal may be triggered by applying a positive bias between the p-type/i-type/n-type infrared photodiode; and the second trigger signal may be triggered by applying a zero bias or a negative bias between the p-type/i-type/n-type infrared photodiode. For example, if the array formed by the infrared photodiode is assumed to have 10 columns (assuming the number is 1 to 10), then a positive bias is applied to odd-numbered pixel arrays so that the odd-numbered columns of pixel array can emit infrared light signals, and a zero bias or a negative bias is applied to even-numbered pixel arrays, so that the even-numbered columns of pixel arrays are in the infrared light detecting state, thus capturing the infrared light reflected from the location where the user's characteristic information is located and converting the infrared light into an infrared image for output. Of course, in some embodiments, the first trigger signal may be triggered by applying a zero bias or a negative bias between the p-type/i-type/n-type infrared photodiode; and the second trigger signal may be triggered by applying a positive bias between the p-type/i-type/n-type infrared photodiode. The first trigger signal may be a light source trigger signal, and the second trigger signal may be a detection trigger signal; of course, the first trigger signal may also be a detection trigger signal, and the second trigger signal may be a light source trigger signal.

In some embodiments, a positive bias and a zero bias or a negative bias may be alternately applied between the p-type/i-type/n-type infrared photodiode to trigger the first trigger signal or the second trigger signal. Similarly, an array formed by the infrared photodiodes with 10 columns of pixel arrays is taken as an example, during the first period, a positive bias is applied to the p-type/i-type/n-type infrared photodiode, so that the 10 columns of pixel arrays are all in an infrared light emitting state; during the second period, a zero bias or a negative bias is applied to the p-type/i-type/n-type infrared photodiode, so that the 10 columns of pixel arrays are all in the infrared light detecting state, which is used for capturing the infrared light information reflected from the location where the user's characteristic information is located and generating a corresponding infrared image output; during the third period, a positive bias is further applied to the p-type/i-type/n-type infrared photodiode, so that the 10 columns of pixel arrays are all in the infrared light emitting state; and repeatedly alternated in the same manner. The light source trigger signal (first trigger signal) and the detection trigger signal (second trigger signal) are alternately switched and conform to a preset frequency. The time interval between adjacent periods can be set according to the actual needs. Preferably, the time interval can be set as the time required for the TFT array to drive scanning each frame of infrared photodiode array to receive at least one frame of complete image signal, that is, the preset frequency is that the switch is performed every said time interval.

In some embodiments, when the display unit is the LCD display or the electronic ink display, a backlight unit is further disposed below the sensing unit, and the sensing unit is disposed between the backlight unit and the LCD display, or between the backlight unit and the electronic ink display. Since the LCD display is not a self-illuminating element, it is necessary to add a backlight unit below the sensing unit during installation. The backlight unit may be an LCD backlight module or other electronic components having a self-illumination function. In other embodiments, when the display unit is an AMOLED display screen, there is no need to provide a backlight unit because the OLED display screen is a self-illuminating element. Through the setting of the above two solutions, the production requirements of different manufacturers can be effectively met, and the applicable range of terminals can be improved.

In some embodiments, the fingerprint recognition area includes a plurality of fingerprint recognition sub-areas, and a lower portion of each of the fingerprint recognition sub-areas is correspondingly provided with a sensing unit. The terminal further includes a sensing unit control circuit, and the method further includes: receiving the user's turning-on instruction for the fingerprint recognition sub-area, and turning on a sensing unit disposed on the lower portion of the fingerprint recognition sub-area by the sensing unit control circuit; and receiving the user's turning-off instruction for the fingerprint recognition sub-area, and turning off the sensing unit disposed on the lower portion of the fingerprint recognition sub-area by the sensing unit control circuit.

Taking the case where the number of fingerprint recognition areas is two as an example, the two fingerprint recognition sub-areas may be evenly distributed on the screen in a certain arrangement manner, such as a top-to-bottom manner, a left-to-right manner, etc. The following describes the application process of the terminal with two fingerprint recognition sub-areas: during the process of use, the user-initiated start signal is received, and the photo detection devices (i.e., sensing units) below the two fingerprint recognition sub-areas are set to an on-state. In a preferred embodiment, the area of the two fingerprint recognition sub-areas covers the entire display screen, so that when the photo detection devices below the two fingerprint recognition sub-areas are all set to the on-state, the optical signal entering the display screen can be absorbed by the TFT image sensor array thin-film (i.e., the sensing unit) disposed below the two fingerprint recognition sub-areas, so as to capture the user's fingerprint information.

In other embodiments, the area composed of the two fingerprint recognition sub-areas may also account for two thirds (⅔), three quarters (¾), etc., of the entire display screen area. Of course, users can also set the photo detection device disposed below one of the fingerprint recognition sub-areas to turn on and the photo detection device disposed below another fingerprint recognition sub-areas to turn off according to their own preferences. When the terminal does not need to be operated, the photo detection devices disposed below the two fingerprint recognition sub-areas can also be set to the off-state. In brief, the photo detection device disposed below each fingerprint recognition sub-area can be turned on or off according to the users' own preferences.

Referring to FIG. 2, which shows a device for synchronously collecting fingerprint information according to another embodiment of the present invention. The device includes the display unit 101 and the sensing unit 102. The display unit is provided with a fingerprint recognition area; and the sensing unit 102 is located below the fingerprint recognition area for acquiring fingerprint information on the fingerprint recognition area. The device includes a sliding track receiving unit; and the sliding track receiving unit is configured to receive a sliding track of the user's finger on the display unit. Moreover, when the user's finger slides to the fingerprint recognition area, the sensing unit is configured to synchronously collect fingerprint information corresponding to the user's finger.

In some embodiments, the display unit 101 includes the touch unit 1011, the processing unit 106, and the storage unit 108. The sliding track receiving unit is the sensing unit 102 or the touch unit 1011. The "sliding track receiving unit is configured to receive the sliding track of the user's finger on the display unit" includes: the sensing unit 102 or the touch unit 1011 is configured to receive the sliding track of the user's finger on the display unit to generate sliding track information, and the processing unit 106 is configured to store the sliding track information in the storage unit 108. In brief, for a terminal with a touch screen, the sliding track information is captured by the sensing unit or the touch unit, which effectively improves the application range of the device.

In some embodiments, the device includes the operation information setting unit 104, the determining unit 107, and the processing unit 106. The operation information setting unit 104 is configured to preset operation configuration information. The operation configuration information includes a corresponding relationship between the operation instruction and the preset fingerprint information. The determining unit 107 is configured to determine whether the fingerprint information corresponding to the user' finger collected synchronously matches the preset fingerprint information in the operation configuration information; if yes, the processing unit 106 is configured to execute an operation instruction corresponding to the preset fingerprint information in the operation configuration information; and if not, the processing unit 106 does not execute the operation instruction corresponding to the preset fingerprint information in the operation configuration information. The comparison of fingerprint information can be implemented by a fingerprint recognition algorithm, and the fingerprint recognition algorithm can be stored in the storage unit of the device. After the sensing unit acquires the fingerprint information in the fingerprint recognition area, the processor of the device will call the fingerprint recognition algorithm in the storage unit to compare the acquired fingerprint information with the preset fingerprint information and determine whether they are matched or not. Fingerprint recognition algorithms include the steps of preprocessing of fingerprint images, data feature extraction, feature matching, fingerprint recognition, etc., which can be implemented by a variety of algorithms. These algorithms are mature existing technologies and have been applied in various fields of encryption and decryption, which are not exhaustively described and repeated in the embodiments again.

In some embodiments, the device further includes the operation instruction receiving unit 105. The "operation information setting unit is configured to preset the operation configuration information" includes: the operation instruction receiving unit 105 is configured to receive the user's setting instruction and display the fingerprint recognition area; the sensing unit 102 is configured to acquire and save the user's fingerprint information on the fingerprint recognition area; the display unit 101 is configured to display an operation instruction identifier list; and the operation instruction identifier list includes one or more identifiers corresponding to operation instructions, each operation instruction identifier corresponds to one operation instruction; the operation instruction receiving unit 105 is further configured to receive the user's selecting instruction for the operation instruction identifier; and the processing unit is configured to establish and save a corresponding relationship between the operation instruction corresponding to a selected operation instruction identifier and the acquired fingerprint information. In this way, according to their own needs, the user can set the more important operations (such as payment operations, startup of certain applications, etc.) to require fingerprint information to be executable; and for less important operations, no selection settings are made.

In some embodiments, the device includes the storage unit 108, and the "sensing unit is configured to acquire and save the user's fingerprint information on the fingerprint recognition area" includes: the determining unit is configured to determine whether the fingerprint information in the user setting process has been stored in the storage unit; when the determination is yes, the processing unit is configured to prompt the user that the fingerprint information has been recorded; and when the determination is negative, the processing unit is configured to save the fingerprint information to the storage unit. In this way, the repeated input of the preset fingerprint information can be effectively avoided, the user's operation steps are reduced, and the user's experience is improved.

In some embodiments, the processing unit is further configured to issue a prompt information when the preset fingerprint information matching the acquired fingerprint information is not recognized. The prompt information includes one or more of voice prompt information, image prompt information, light prompt information, and video prompt information. The prompt information can play the role of warning. When the user knows that the current fingerprint information is not successfully entered according to the prompt information, the user may choose to perform the fingerprint input operation again. The fingerprint input operation may be implemented by sliding the finger on the touch unit to obtain the sliding track information, such as inputting the electronic signature on the display unit again.

In some embodiments, the "determining unit is configured to determine whether the fingerprint information corresponding to the user' finger collected synchronously matches the preset fingerprint information in the operation configuration information" includes: the processing unit is configured to calculate a feature value according to the fingerprint information corresponding to the user's finger synchronously collected by the sensing unit, and the determining unit is configured to compare the calculated feature value with that of the preset fingerprint information; when the error is smaller than the preset error, it is determined as a match; otherwise, it is determined as a mismatch. Through the comparison of the feature values, the error of fingerprint recognition can be effectively reduced, and the accuracy of fingerprint recognition is ensured.

In some embodiments, the device includes the storage unit 108; and the processing unit is further configured to store the fingerprint information corresponding to the user's finger collected synchronously in the storage unit. After the sensing unit collects the fingerprint information of the use's finger, the comparison of the fingerprint information may not be performed immediately, or the fingerprint information may be extracted and called after a period of time. Preferably, the storage unit is a non-volatile memory, such as a mobile phone memory, a hard disk, a USB flash drive, etc.

In some embodiments, the fingerprint recognition area includes a plurality of fingerprint recognition sub-areas, and a lower portion of each of the fingerprint recognition sub-areas is correspondingly provided with a sensing unit. The device includes an operation instruction receiving unit and a sensing unit control circuit. The operation instruction receiving unit is configured to receive the user's turning-on instruction for the fingerprint recognition sub-areas, and the sensing unit control circuit is configured to turn on the sensing unit disposed on the lower portion of each of the fingerprint recognition sub-areas; or, the operation instruction receiving unit is configured to receive the user's turning-off instruction for the fingerprint recognition sub-areas, and the sensing unit control circuit is configured to turn off the sensing unit disposed on the lower portion of each of the fingerprint recognition sub-areas. The photo detection device (i.e., sensing unit) disposed below each fingerprint recognition sub-area can be turned on or off according to the users' own preferences, thereby effectively improving the users' sensory experience.

It should be noted that, in this context, relationship terms such as first and second are used merely to distinguish one entity or operation from another entity or operation, and do not necessarily require or imply any such actual relationship or order between those entities or operations. Furthermore, the terms "include/comprise" or "contain" or any other variations are intended to encompass a non-exclusive inclusion, such that a process, method, object, or terminal device that includes a plurality of elements includes not only those elements but also other elements not explicitly listed, or includes elements inherent to such a process, method, object, or terminal device. Without further limitation, the elements defined by the sentence "including/comprising . . . " or "containing . . . " do not exclude the existence of additional elements in the process, method, object or terminal device including the elements. In addition, in this context, "greater than", "less than", "exceeds", etc. shall be construed to exclude the figure; and "above", "below", "inside", etc. shall be construed to include the figure.

Those skilled in the art shall understand that the various embodiments described above can be provided as a method, a device, or a computer program product. These embodiments may take the form of an entirely hardware embodiment, an entirely software embodiment, or a combination of software and hardware aspects. All or part of the steps in the method involved in the foregoing embodiments may be completed by instructing relevant hardware by a program, and the program may be stored in a storage medium readable by a computer device for executing all or part of the steps in the method of the foregoing embodiments. The computer device includes, but is not limited to, a personal computer, a server, a general purpose computer, a special purpose computer, a network device, an embedded device, a programmable device, a smart mobile terminal, a smart household device, a wearable smart device, a vehicle-mounted smart device, etc. The storage medium includes, but is not limited to, a RAM, a ROM, a magnetic disk, a magnetic tape, an optical disk, a flash memory, a USB flash drive, a mobile hard disk, a memory card, a memory stick, a network server storage, a network cloud storage, etc.

The above embodiments are described with reference to process flow diagrams and/or block diagrams of methods, devices (systems), and computer program products according to the embodiments. It shall be understood that each process and/or block in the process flow diagram and/or block diagram and the combination of process and/or block in the process flow diagram and/or block diagram can be realized by computer program instructions. These computer program instructions can be provided to a processor of a computer device to produce a device, such that when the instructions executed by the processor of the computer device, a device for implementing the functions specified in one or more processes in a process flow diagram and/or one or more blocks in a block diagram is produced.

These computer program instructions can also be stored in a computer device readable memory that can direct guide the computer device to operate in a particular manner, thereby enabling the instructions stored in the computer device readable memory to produce a manufacture including an instruction device, and the instruction device implements the functions specified in one or more processes in a process flow diagram and/or one or more blocks in a block diagram.

These computer program instructions can also be loaded onto a computer device, enabling a series of operating steps to be executed on the computer device to produce computer-implemented processing, and thus the instructions executed on the computer device provide steps for implementing the functions specified in one or more processes in a process flow diagram and/or one or more blocks in a block diagram.

Although the above embodiments have been described, those skilled in the art can make other changes and modifications to these embodiments once they have learned the basic inventive concept. Therefore, the above descriptions are only the embodiments of the present invention, and thus does not limit the patent protective scope of the present invention. Similarly, any equivalent structure or equivalent process transformation made by using the present specification and the drawings, or directly or indirectly applied to other relevant technical fields, shall be included in the patent protective scope of the present invention.

What is claimed is:

1. A method for synchronously collecting fingerprint information, characterized in that, the method is applied to a device for synchronously collecting fingerprint information, and the device comprises a display unit and a sensing unit; the display unit is provided with a fingerprint recognition area, and the sensing unit is configured to acquire fingerprint information on the fingerprint recognition area; wherein the method comprises:
   presetting operation configuration information; wherein the operation configuration information comprises a corresponding relationship between operation instruction and preset fingerprint information; wherein the method does not comprise presetting sliding track information;
   receiving a sliding track of a user's finger on the display unit; and synchronously collecting fingerprint information corresponding to the user's finger when the user's finger slides to the fingerprint recognition area;
   wherein the method further comprises:
   generating sliding track information, and storing the sliding track information;
   wherein the method does not comprise determining whether the sliding track information is matched.

2. The method for synchronously collecting fingerprint information according to claim 1, characterized in that, the display unit comprises a touch unit; receiving the sliding track of the user's finger on the display unit comprises:
   receiving, by the sensing unit or the touch unit, the sliding track of the user's finger on the display unit.

3. The method for synchronously collecting fingerprint information according to claim 1, characterized in that, the method comprises:
   determining whether the synchronously collected fingerprint information corresponding to the user's finger matches the preset fingerprint information in the operation configuration information; if yes, executing the operation instruction corresponding to the preset fingerprint information in the operation configuration information; and if not, not executing the operation instruction corresponding to the preset fingerprint information in the operation configuration information.

4. The method for synchronously collecting fingerprint information according to claim 1, characterized in that, presetting the operation configuration information comprises:
   receiving the user's setting instruction and displaying the fingerprint recognition area;
   acquiring and saving the user's fingerprint information on the fingerprint recognition area;
   displaying an operation instruction identifier list, wherein the operation instruction identifier list comprises one or more identifiers corresponding to operation instructions;
   receiving the user's selecting instruction for the operation instruction identifier; and
   establishing and saving a corresponding relationship between the operation instruction corresponding to a selected operation instruction identifier and the acquired fingerprint information.

5. The method for synchronously collecting fingerprint information according to claim 4, characterized in that, the device comprises a storage unit, and acquiring and saving the user's fingerprint information on the fingerprint recognition area comprises:
   determining whether the fingerprint information in a user setting process has been stored in the storage unit; when the determination is yes, prompting the user that the fingerprint information has been recorded; and when the determination is negative, saving the fingerprint information to the storage unit.

6. The method for synchronously collecting fingerprint information according to claim 3, characterized in that, determining whether the fingerprint information corresponding to the user's finger collected synchronously matches the preset fingerprint information in the operation configuration information comprises: calculating a feature value according to the fingerprint information corresponding to the user's finger synchronously collected by the sensing unit, and comparing the feature value with a feature value of the preset fingerprint information; when an error is smaller than a preset error, determining as a match; otherwise, determining as a mismatch.

7. The method for synchronously collecting fingerprint information according to claim 1, characterized in that, the device comprises a storage unit; and the method further comprises: storing the synchronously collected fingerprint information corresponding to the user's finger in the storage unit.

8. The method for synchronously collecting fingerprint information according to claim 1, characterized in that, the fingerprint recognition area comprises a plurality of fingerprint recognition sub-areas, and each of the fingerprint recognition sub-areas is correspondingly provided with a sensing unit.

9. The method for synchronously collecting fingerprint information according to claim 8, characterized in that, the method comprises:
   receiving the user's turning-on instruction for the fingerprint recognition sub-area, and turning on a sensing unit corresponding to the fingerprint recognition sub-area; or
   receiving the user's turning-off instruction for the fingerprint recognition sub-area, and turning off the sensing unit corresponding to the fingerprint recognition sub-area.

10. A device for synchronously collecting fingerprint information, characterized in that, the device comprises a display unit a sensing unit, an operation information setting unit, and a sliding track receiving unit; wherein the display unit is provided with a fingerprint recognition area; the sensing unit is configured to acquire fingerprint information on the fingerprint recognition area;
   the operation information setting unit is configured to preset operation configuration information, the operation configuration information comprises a corresponding relationship between the operation instruction and the preset fingerprint information, the operation configuration information does not comprise presetting sliding track information;

the sliding track receiving unit is configured to receive a sliding track of user's finger on the display unit; and when the user's finger slides to the fingerprint recognition area, the sensing unit is configured to synchronously collect fingerprint information corresponding to the user's finger;

wherein the display unit comprises a storage unit, the sliding track receiving unit is configured to receive the sliding track of the user's finger on the display unit to generate sliding track information, and the sliding track information is stored in the storage unit;

wherein the sliding track information is not determined to be matched or not.

11. The device for synchronously collecting fingerprint information according to claim 10, characterized in that, the display unit comprises a touch unit; the sliding track receiving unit is a sensing unit or a touch unit; and the sliding track receiving unit is configured to receive the sliding track of the user's finger on the display unit comprises:

the sensing unit or the touch unit is configured to receive the sliding track of the user's finger on the display unit to generate the sliding track information.

12. The device for synchronously collecting fingerprint information according to claim 10, characterized in that, the device further comprises a determining unit, and a processing unit; and the determining unit is configured to determine whether the synchronously collected fingerprint information corresponding to the user's finger matches the preset fingerprint information in the operation configuration information; if yes, the processing unit is configured to execute an operation instruction corresponding to the preset fingerprint information in the operation configuration information; and if not, the processing unit does not execute the operation instruction corresponding to the preset fingerprint information in the operation configuration information.

13. The device for synchronously collecting fingerprint information according to claim 10 characterized in that, the device further comprises an operation instruction receiving unit, and the operation information setting unit is configured to preset the operation configuration information comprises:

the operation instruction receiving unit is configured to receive the user's setting instruction and display the fingerprint recognition area;

the sensing unit is configured to acquire and save the user's fingerprint information on the fingerprint recognition area;

the display unit is configured to display an operation instruction identifier list; and the operation instruction identifier list comprises one or more identifiers corresponding to operation instructions;

the operation instruction receiving unit is further configured to receive the user's selecting instruction for the operation instruction identifier; and the processing unit is configured to establish and save a corresponding relationship between the operation instruction corresponding to a selected operation instruction identifier and the acquired fingerprint information.

14. The device for synchronously collecting fingerprint information according to claim 13, characterized in that, the device comprises a storage unit, and the sensing unit is configured to acquire and save the user's fingerprint information on the fingerprint recognition area comprises:

the determining unit is configured to determine whether the fingerprint information in the user setting process has been stored in the storage unit; when the determination is yes, the processing unit is configured to prompt the user that the fingerprint information has been recorded; and when the determination is negative, the processing unit is configured to save the fingerprint information to the storage unit.

15. The device for synchronously collecting fingerprint information according to claim 12, characterized in that, the processing unit is further configured to issue a prompt information when the preset fingerprint information matching the acquired fingerprint information is not recognized.

16. The device for synchronously collecting fingerprint information according to claim 12, characterized in that, the determining unit is configured to determine whether the fingerprint information corresponding to the user's finger collected synchronously matches the preset fingerprint information in the operation configuration information comprises: the processing unit is configured to calculate a feature value according to the fingerprint information corresponding to the user's finger synchronously collected by the sensing unit, and the determining unit is configured to compare the calculated feature value with a feature value of the preset fingerprint information; when an error is smaller than a preset error, the determining unit determines as a match; otherwise, the determining unit determines as a mismatch.

17. The device for synchronously collecting fingerprint information according to claim 10, characterized in that, the device comprises a storage unit and a processing unit, wherein the processing unit is further configured to store the synchronously collected fingerprint information corresponding to the user's finger by the sensing unit in the storage unit.

18. The device for synchronously collecting fingerprint information according to claim 10, characterized in that, the sensing unit comprises a TFT image sensor array thin-film.

19. The device for synchronously collecting fingerprint information according to claim 10, characterized in that, the display unit comprises a display screen with an active array thin film transistor for scanning drive and data transmission, and the display screen comprises an AMOLED display, a liquid crystal display (LCD display), a micro light-emitting diode display, a quantum dot display, or an electronic ink display.

20. The device for synchronously collecting fingerprint information according to claim 19, characterized in that, the sensing unit comprises a TFT image sensor array thin-film; when the display unit is the LCD display or the electronic ink display, the TFT image sensor array thin-film comprises an infrared sensing layer; and the infrared sensing layer is an array formed by an infrared photodiode or an infrared phototransistor.

21. The device for synchronously collecting fingerprint information according to claim 10, characterized in that, the fingerprint recognition area comprises a plurality of fingerprint recognition sub-areas, and each of the fingerprint recognition sub-areas is correspondingly provided with a sensing unit.

22. The device for synchronously collecting fingerprint information according to claim 21, characterized in that, the device comprises an operation instruction receiving unit and a sensing unit control circuit; the operation instruction receiving unit is configured to receive the user's turning-on instruction for the fingerprint recognition sub-areas, and the sensing unit control circuit is configured to turn on the sensing unit corresponding to the fingerprint recognition sub-areas; or, the operation instruction receiving unit is configured to receive the user's turning-off instruction for the fingerprint recognition sub-areas, and the sensing unit control circuit is configured to turn off the sensing unit corresponding to the fingerprint recognition sub-areas.

23. The method for synchronously collecting fingerprint information according to claim 1, characterized in that, each fingerprint information is corresponded to an operation instruction, and each operation instruction is triggered by one or more fingerprint information.

24. The device for synchronously collecting fingerprint information according to claim 10, characterized in that, each fingerprint information is corresponded to an operation instruction, and each operation instruction is triggered by one or more fingerprint information.

\* \* \* \* \*